(12) United States Patent
Yamada

(10) Patent No.: US 8,653,864 B2
(45) Date of Patent: Feb. 18, 2014

(54) RESET CIRCUIT

(75) Inventor: Susumu Yamada, Oizumi-machi (JP)

(73) Assignee: Semiconductor Components Industries, LLC, Phoenix, AZ (US)

(*) Notice: Subject to any disclaimer, the term of this patent is extended or adjusted under 35 U.S.C. 154(b) by 135 days.

(21) Appl. No.: 12/893,755

(22) Filed: Sep. 29, 2010

(65) Prior Publication Data

US 2011/0074473 A1 Mar. 31, 2011

(30) Foreign Application Priority Data

Sep. 29, 2009 (JP) ................... 2009-224993

(51) Int. Cl.
*H03L 7/00* (2006.01)
(52) U.S. Cl.
USPC ................ 327/143; 327/74; 327/76
(58) Field of Classification Search
USPC ............ 327/74, 76, 77, 80, 142, 143, 198
See application file for complete search history.

(56) References Cited

U.S. PATENT DOCUMENTS

| 7,453,295 | B2 | 11/2008 | Hotaka | |
|---|---|---|---|---|
| 8,035,428 | B2 * | 10/2011 | Kang | 327/143 |
| 2008/0012613 | A1 | 1/2008 | Hotaka | |

FOREIGN PATENT DOCUMENTS

JP 2008-005000 A 1/2008

* cited by examiner

*Primary Examiner* — Long Nguyen

(57) ABSTRACT

In some embodiments, a reset circuit for an electronic circuit equipped with a backup power capacitor includes a first detector arranged to detect a predetermined first voltage of the backup capacitor, a second detector arranged to detect a predetermined second voltage of the backup capacitor, the second voltage being lower than the first voltage, and a controller arranged to control an output of a reset request signal based on detection results of the first detector and the second detector. The controller is configured to output the reset request signal when the first detector detects the first voltage after the second detector detected the second detector.

11 Claims, 4 Drawing Sheets

RESET CIRCUIT

This application claims priority under 35 U.S.C. §119 to Japanese Patent Application No. 2009-224993 filed on Sep. 29, 2009, the entire disclosure of which is incorporated herein by reference in its entirety.

BACKGROUND OF THE INVENTION

1. Field of the Invention

Some preferred embodiments of the present invention relate to a reset circuit for an electronic circuit equipped with a power backup capacitor.

2. Description of the Related Art

The following description sets forth the inventor's knowledge of related art and problems therein and should not be construed as an admission of knowledge in the prior art.

In recent years, an electronic circuit, such as, e.g., an LSI circuit (hereinafter referred to as "electronic circuit",) mounting a power backup capacitor has been increasing. In such an electronic circuit, even if the power supply is interrupted due to, e.g., electric power failure, the electronic circuit can be continuously operated for a certain period of time using electric charges stored in the power backup capacitor. With this power backup capacitor, if the power failure continues only for a short period of time, for example, the data will not be cleared due to the power interruption. More specifically, in an electronic device having a timer recording function, the risk of occurrence of such inconvenience that the scheduled timer recording cannot be performed due to the power interruption can be reduced as low as possible.

Electric charges stored in a power backup capacitor will reduce with time, and therefore it is required to reset the electronic circuit before the backup voltage becomes lower than the operation lower limit voltage of the circuit to prevent a runaway thereof.

During the backup operation using the electric charges stored in the power backup capacitor, a predetermined voltage is generally used as a low reset voltage at which the circuit is reset when the backup voltage becomes lower than the predetermined voltage. When the power supply is resumed and then the backup voltage becomes higher than the reset voltage, the reset is terminated to resume the operation.

In a normal low voltage reset circuit, as shown in FIG. 4, when the voltage of the power backup capacitor becomes lower than a predetermined low reset voltage, a reset request signal is outputted, and when the voltage of the power backup capacitor becomes higher than the predetermined low reset voltage, the reset request signal is released. The reset state will be maintained when the voltage of the power backup capacitor is kept lower than the predetermined low reset voltage.

According to the aforementioned prior art, however, during the process in which the voltage of the power backup capacitor raises after resuming of the power supply, there is a risk that a malfunction occurs during the voltage fluctuates before restoring to the normal operation voltage after exceeding the predetermined reset voltage.

More specifically, for example, when power supply from the main power source is interrupted for some reasons, the electronic circuit enters into a backup state in which the circuit is operated by the electric charges stored in the power backup capacitor. The electric charges of the power backup capacitor gradually decrease with time, which in turn causes dropping of the voltage of the power backup capacitor. When the voltage reaches a predetermined voltage, the low voltage reset circuit resets the electronic circuit to prevent the possible malfunction. In order to secure the time from the interruption of the main power supply to the reset of the electronic circuit by detecting the low reset voltage as long as possible, it is required to approach the low reset voltage to the operation lower limit voltage Vmin of the LSI as close as possible.

However, in cases where the low reset voltage is lowered too much, when the power supply is resumed and then the power supply voltage Vdd raises slightly, the reset state will be released. In this case, since the reset release timing is too early, the operation will be resumed at unstable voltages not sufficiently high. This may cause malfunction of the electronic circuit. To prevent such malfunction, if the low reset voltage is raised, the backup operation time becomes shorter.

Even in cases where a reset voltage can be set using a microcomputer in a programmable manner, it is hard to find the most suitable low reset voltage value.

Furthermore, in cases where a width of a conventional reset signal is increased using a counter, it is difficult to assuredly prevent the operation at unstable voltages while securing a sufficient time of the backup operation.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a reset circuit capable of minimizing a risk of malfunction of an electronic circuit when a power supply is resumed from a backup state.

According to a first aspect of the present invention, among other potential advantages, some embodiments can provide a reset circuit including a first detector arranged to detect a predetermined first voltage of a power source;

a second detector arranged to detect a predetermined second voltage of the power source, the second voltage being lower than the first voltage; and a controller arranged to control an output of a reset request signal based on detection results of the first detector and the second detector, wherein the controller is configured to output the reset request signal when the first detector detects the first voltage after the second detector detected the second voltage.

In some examples, it can be configured such that the controller makes the first detector detectable after the second detector detected that a voltage of the backup capacitor became below the second voltage and makes an output from the first detector into the reset request signal.

In some examples, it can be configured such that the controller is configured to receive a reset receipt signal and initialize the reset request signal to prohibit the reset request.

In some examples, it can be configured such that the second detector is constituted by an ADC circuit, wherein the controller includes a register, and wherein the ADC circuit is configured to output a reset enabling signal to set a permission flag in the register to permit changing of the reset request signal when the permission flag is set.

According to a second aspect of the present invention, some preferred embodiments provide a reset circuit for an electronic circuit equipped with a power backup capacitor. The reset circuit includes a first detector arranged to detect a predetermined first voltage of the backup capacitor, a second detector arranged to detect a predetermined second voltage of the backup capacitor, the second voltage being lower than the first voltage, and a controller arranged to control an output of a reset request signal based on detection results of the first detector and the second detector. The controller is configured to output the reset request signal when the first detector detects the first voltage after the second detector detected the second voltage.

According to a third aspect of the present invention, some preferred embodiments provide an electronic circuit equipped with a backup operation circuit, a reset circuit, and a power backup capacitor, the reset circuit comprising:

a first detector arranged to detect a predetermined first voltage of the backup capacitor;

a second detector arranged to detect a predetermined second voltage of the backup capacitor, the second voltage being lower than the first voltage; and a reset controller arranged to control an output of a reset request signal based on detection results of the first detector and the second detector, wherein the controller is configured to output the reset request signal to the backup operation circuit when the first detector detects the first voltage after the second detector detected the second voltage.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the present invention will be described by way of example and not limitation. It should be understood based on this disclosure that various other modifications can be made by those in the art based on these illustrated embodiments.

Hereinafter, some preferable embodiments of the present invention will be explained with reference to the attached drawings. In the following explanation, although the reset circuit applied to a backup operation control LSI will be explained, it should be understood that the present invention can be applied to various electronic circuits.

First Embodiment

Figure 1:
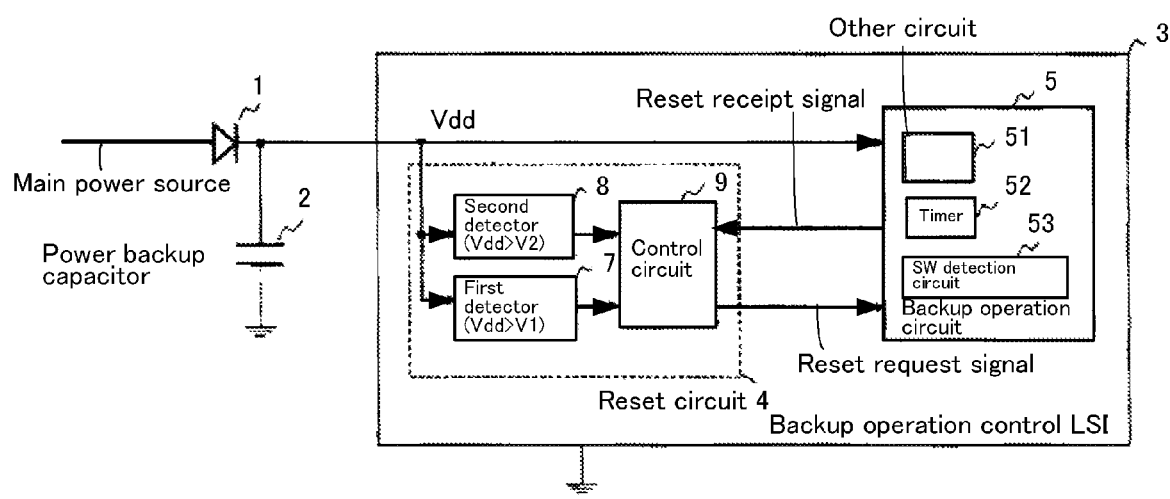
FIG. 1 is a schematic structural view showing a reset circuit according to a first embodiment of the present invention.

FIG. 1 is a structural view of a reset circuit according to a first embodiment of the present invention. In FIG. 1, the reference numeral "1" denotes a diode, "2" denotes a power backup capacitor, and "3" denotes a backup operation control LSI (Large-scale integration). The LSI includes a reset circuit 4 and a backup operation circuit 5.

A power supply line from a main power source is connected to the reset circuit 4 and the backup operation circuit 5 via the diode 1. Connected between the diode 1 and the LSI 3 is a power backup capacitor 2 for supplying a backup power to the LSI 3. The diode 1 is arranged to prevent electric charges stored in the power backup capacitor 2 from flowing back to the main power source when the power supply from the main power source is interrupted.

The reset circuit 4 includes a first detector 7, a second detector 8, and a control circuit (controller) 9. The first detector 7 and the second detector 8 are each arranged to detect a voltage of the backup capacitor 2, and the detection voltage of each of the first and second detectors 7 and 8 can be set arbitrarily, respectively.

In this embodiment, two predetermined voltages, i.e., a first voltage V1 and a second voltage V2 will be detected by the first detector 7 and the second detector 8, respectively, for the reset operation of the LSI 3.

Figure 2:
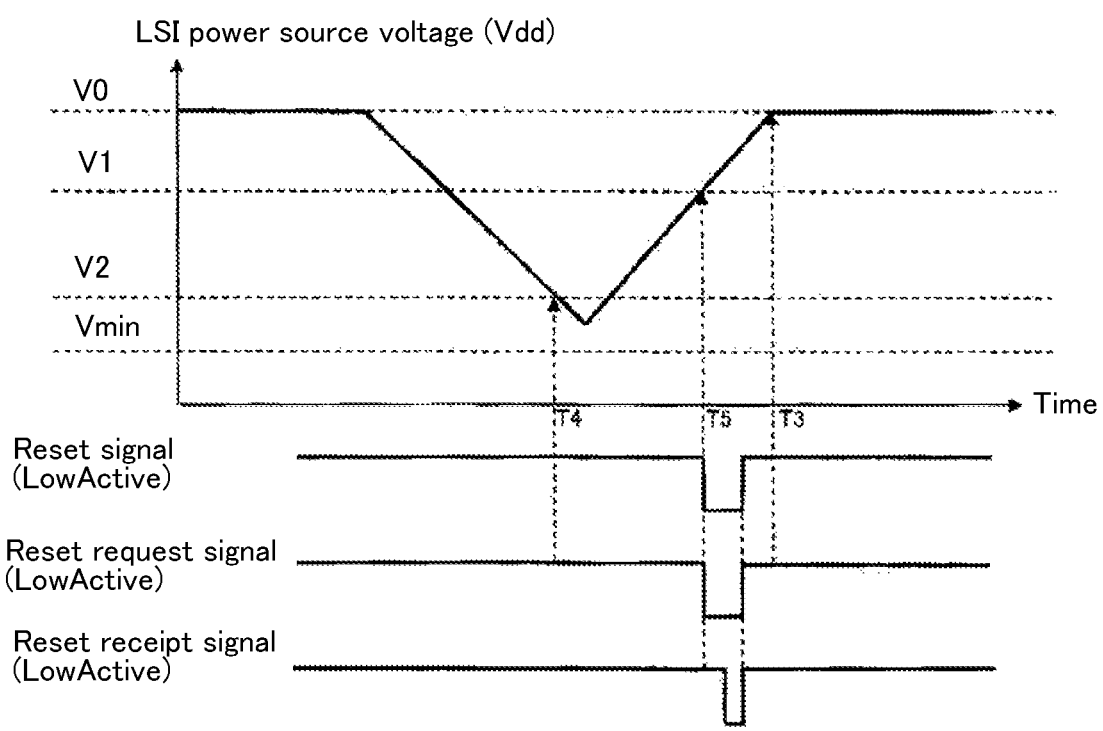
FIG. 2 is a timing chart of an operation of the reset circuit of the first embodiment shown in FIG. 1.

In this embodiment, a normal voltage applied to the backup operation control LSI 3 when the main power supply is active is defied as "V0," and the operation minimum voltage of the LSI 3 is defined as "Vmin," and the first voltage V1 and the second voltage V2 will be set so as to meet the condition of V0>V1>V2>Vmin, as shown in FIG. 2.

The operation of the reset circuit 4 from the start of the power backup due to an interruption of the main power supply to the termination of the power backup due to the resuming of the main power supply will be explained with reference to FIG. 2.

When the main power supply is active, the voltage of the backup capacitor 2 is in a fully-charged state and maintains the voltage V0. Thereafter, when the main power supply is interrupted for some reasons, the backup capacitor 2 starts to supply the voltage to the LSI 3. As the backup capacitor 2 is discharged, the voltage of the backup capacitor 2 gradually decreases, becomes lower than V1, and then becomes lower than V2 as shown in FIG. 2.

After the voltage of the backup capacitor 2 became lower than V2, when the main power supply is resumed, the voltage of the power supply line starts to rise, becomes higher than V2, and then becomes higher than V1. At this period, the control circuit 9 outputs a reset request signal to the backup operation circuit 5.

During this operation, the first detector 7 initially detects the first voltage V1 during the drop of the voltage. In the initial state, however, the control circuit 9 prohibits outputting the reset request signal to the backup operation circuit 5 based on the detection result of the first detector 7. When the second detector 8 detected that the voltage of the backup capacitor 2 became lower than V2 and then the first detector 7 detects that the voltage of the backup capacitor 2 becomes higher than V1, the control circuit 9 now allows outputting a reset request signal based on the detection result of the first detector 7. In other words, the controller 9 is configured to output the reset request signal when the voltage of the backup capacitor 2 once became lower than V2, and then became higher than V1.

Alternatively, the control circuit 9 can be configured such that, when the second detector 8 detects the second voltage 8, the control circuit 9 makes the first detector 7 detectable, so that the output of the first detector 7 can be used as a reset request signal as it is. In this case, the consumption current of the first detector 7 can be reduced by detecting the first voltage V1 only when needed.

In the backup operation circuit 5 which received the reset request signal outputted from the control circuit 9, a reset signal is generated upon receipt of the reset request signal. When the backup operation control LSI 3 is reset, the backup operation circuit 5 generates a reset receipt signal and outputs it to the control circuit 9. The control circuit 9 which received the reset receipt signal makes the reset request signal inactive to terminate the reset request. With this operation, the backup operation control LSI 3 changes from the reset state to the normal operation state.

For the purpose of more stably resetting the backup operation control LSI 3, in the backup operation control LSI 3, it can be configured to use a timer 52 embedded in the backup operation circuit 5 to set a reset period. In cases where no timer is embedded in the backup operation circuit 5, the other circuit 51 can include a capacitor and a resistor to secure the stable secure reset period by the CR time constant of the capacitor and the resistor.

Second Embodiment

Figure 3:
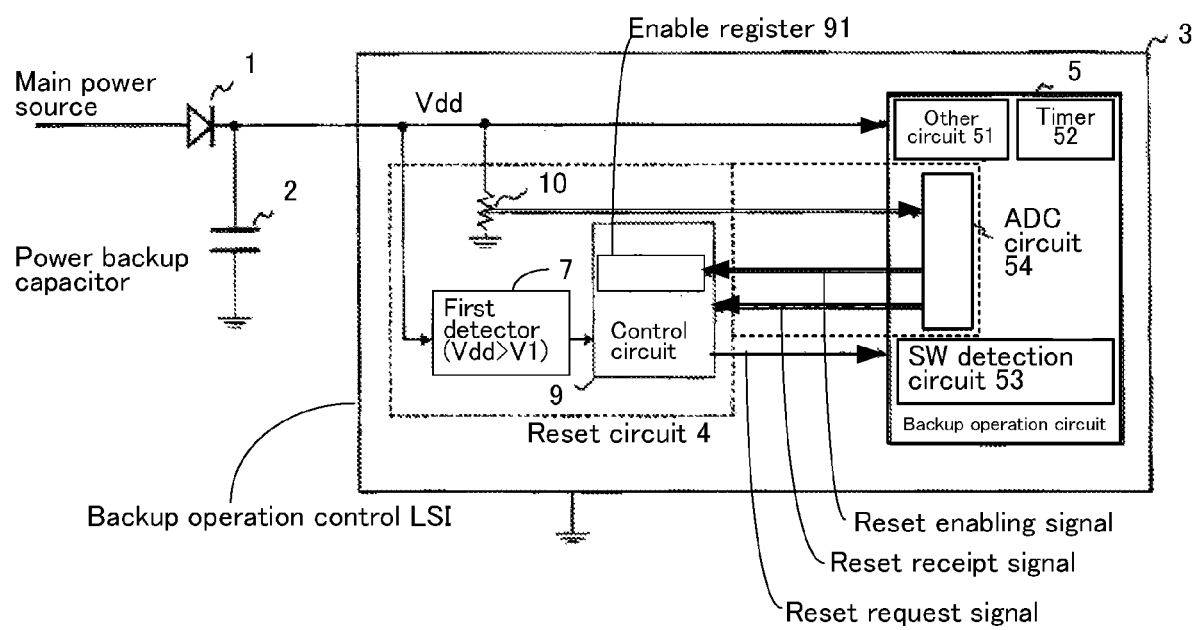
FIG. 3 is a schematic structural view showing a reset circuit according to a second embodiment of the present invention.
Figure 4:
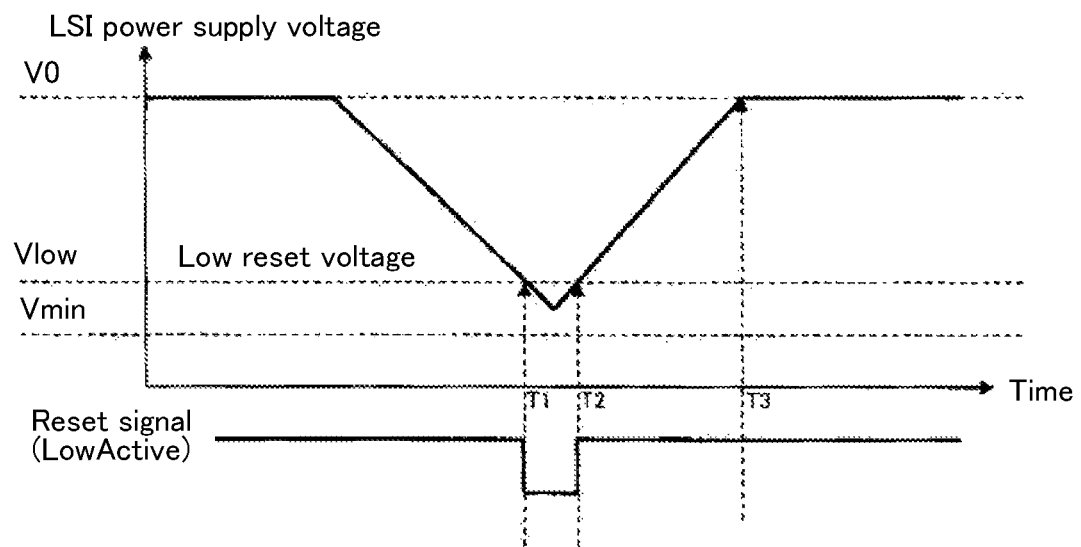
FIG. 4 is a timing chart of an operation of a conventional reset circuit.

FIG. 3 shows a second embodiment of the present invention. In this embodiment, as the second detector 8 shown in the first embodiment, an ADC circuit (A/D converter circuit) 54 embedded in the backup operation circuit 5 is used. The other structure is the same as that of the first embodiment, and therefore the cumulative explanation will be omitted by allotting the same reference numeral to the corresponding portion.

By using the ADC circuit 54 in place of the second detector 8 of the first embodiment, the second detector 8 can be eliminated, which results in a reduced circuit size. In this embodiment, one end of a resistor 10 is connected to the power supply line and the other end is grounded. A voltage obtained by dividing the power supply voltage Vdd with the resistor 10 is applied to the ADC circuit 54. The ADC circuit 54 can assume the power supply voltage Vdd depending on the magnitude of the voltage obtained by dividing the power supply voltage Vdd. This enables to detect whether or not the power supply voltage Vdd becomes lower than V2.

When the ADC circuit detects that the power supply voltage Vdd became lower than V2, the ADC circuit 54 outputs a reset enabling signal to the control circuit 9. This control circuit 9 is equipped with an enable register 91. Receiving the reset enabling signal, the control circuit 9 sets a permission flag which permits outputting a reset request signal in the enable register 91. When the main power supply is resumed and the power supply voltage gradually increases and becomes higher than V1 in a state in which the permission flag is set, the control circuit 9 can output a reset request signal.

In the backup operation circuit 5 which received the reset request signal outputted from the control circuit 9, a reset signal is generated upon receipt of the reset request signal. When the backup operation control LSI 3 is reset, the backup operation circuit 5 generates a reset receipt signal and outputs it to the control circuit 9. The control circuit 9 which received the reset receipt signal makes the reset request signal inactive to terminate the reset request. With this, the backup operation control LSI 3 changes from the reset state to the normal operation state. When the entire backup operation control LSI 3 is reset, the enable register 91 is initialized. This puts the flag down.

In this second embodiment, the ADC circuit 54 is used in place of the second detector 8 of the first embodiment. Such ADC circuit 54 is high in general versatility and often embedded in an LSI for another purposes, and therefore can be effectively used.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A reset circuit, comprising:
   a first detector arranged to detect that a voltage of a power source has reached a predetermined first voltage;
   a second detector arranged to detect that the voltage of the power source has reached a predetermined second voltage, the second voltage being lower than the first voltage; and a controller arranged to control an output of a reset request signal based on detection results of the first detector and the second detector,
wherein the controller is configured to output the reset request signal when the first detector detects the first voltage after the second detector detected the second voltage, and
wherein the controller makes the first detector detectable after the second detector detected that a voltage of a backup capacitor connected to the power source became below the second voltage and makes an output from the first detector into the reset request signal.

2. The reset circuit as recited in claim 1, wherein the controller is configured to receive a reset receipt signal and initialize the reset request signal to prohibit the reset request.

3. A reset circuit, comprising:
a first detector arranged to detect a predetermined first voltage of a power source;
a second detector arranged to detect a predetermined second voltage of the power source, the second voltage being lower than the first voltage; and
a controller arranged to control an output of a reset request signal based on detection results of the first detector and the second detector,
wherein the controller is configured to output the reset request signal when the first detector detects the first voltage after the second detector detected the second voltage,
wherein the second detector is constituted by an ADC circuit,
wherein the controller includes a register, and
wherein the ADC circuit is configured to output a reset enabling signal to set a permission flag in the register to permit changing of the reset request signal when the permission flag is set.

4. A reset circuit for an electronic circuit equipped with a power backup capacitor,
the reset circuit comprising:
a first detector arranged to detect a predetermined first voltage of the backup capacitor;
a second detector arranged to detect a predetermined second voltage of the backup capacitor, the second voltage being lower than the first voltage; and
a controller arranged to control an output of a reset request signal based on detection results of the first detector and the second detector,
wherein the controller is configured to output the reset request signal when the first detector detects the first voltage after the second detector detected the second voltage.

5. The reset circuit as recited in claim 4, wherein the controller makes the first detector detectable after the second detector detected that a voltage of the backup capacitor became below the second voltage and makes an output from the first detector into the reset request signal.

6. The reset circuit as recited in claim 5, wherein the controller is configured to receive a reset receipt signal and initialize the reset request signal to prohibit the reset request.

7. The reset circuit as recited in claim 4,
wherein the second detector is constituted by an ADC circuit,
wherein the controller includes a register, and
wherein the ADC circuit is configured to output a reset enabling signal to set a permission flag in the register to permit changing of the reset request signal when the permission flag is set.

8. An electronic circuit equipped with a backup operation circuit, a reset circuit, and a power backup capacitor,
the reset circuit comprising:
a first detector arranged to detect a predetermined first voltage of the backup capacitor;
a second detector arranged to detect a predetermined second voltage of the backup capacitor, the second voltage being lower than the first voltage; and
a reset controller arranged to control an output of a reset request signal based on detection results of the first detector and the second detector,
wherein the controller is configured to output the reset request signal to the backup operation circuit when the first detector detects the first voltage after the second detector detected the second voltage.

9. The reset circuit as recited in claim 8, wherein the controller makes the first detector detectable after the second detector detected that a voltage of the backup capacitor became below the second voltage and makes an output from the first detector into the reset request signal.

10. The reset circuit as recited in claim 9, wherein the controller is configured to receive a reset receipt signal and initialize the reset request signal to prohibit the reset request.

11. The reset circuit as recited in claim 8,
wherein the second detector is constituted by an ADC circuit,
wherein the controller includes a register, and
wherein the ADC circuit is configured to output a reset enabling signal to set a permission flag in the register to permit changing of the reset request signal when the permission flag is set.

* * * * *